(12) United States Patent
Ama et al.

(10) Patent No.: US 11,727,978 B2
(45) Date of Patent: Aug. 15, 2023

(54) SEMICONDUCTOR DEVICE AND METHOD OF CONTROLLING SEMICONDUCTOR DEVICE

(71) Applicant: LAPIS Technology Co., Ltd., Yokohama (JP)

(72) Inventors: Kota Ama, Yokohama (JP); Katsuaki Matsui, Yokohama (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 0 days.

(21) Appl. No.: 17/703,968

(22) Filed: Mar. 24, 2022

(65) Prior Publication Data

US 2022/0319572 A1 Oct. 6, 2022

(30) Foreign Application Priority Data

Mar. 30, 2021 (JP) .................................. 2021-058177

(51) Int. Cl.
*G11C 11/4093* (2006.01)
*G11C 11/4074* (2006.01)
*G11C 11/4076* (2006.01)
*H03K 19/003* (2006.01)
*H03K 19/0185* (2006.01)

(52) U.S. Cl.
CPC ...... *G11C 11/4074* (2013.01); *G11C 11/4076* (2013.01); *H03K 19/00315* (2013.01); *H03K 19/00323* (2013.01); *H03K 19/018521* (2013.01)

(58) Field of Classification Search
CPC ............ G11C 11/4074; G11C 11/4076; G11C 11/4093; G11C 7/1084; H03K 19/00315; H03K 19/00323; H03K 19/018521; H03K 19/017509; H03K 5/156
See application file for complete search history.

(56) References Cited

U.S. PATENT DOCUMENTS

| 7,843,222 | B1 * | 11/2010 | Shiah .................. H03K 19/017 326/87 |
| 9,589,627 | B1 * | 3/2017 | Wilson ................ G11C 11/4074 |
| 2007/0194815 | A1 * | 8/2007 | Nelson ............. H03K 19/00323 327/112 |

(Continued)

FOREIGN PATENT DOCUMENTS

| JP | H11274317 A | 10/1999 |
| JP | 2019102962 A | 6/2019 |

*Primary Examiner* — Seokjin Kim
(74) *Attorney, Agent, or Firm* — Rabin & Berdo, P.C.

(57) ABSTRACT

A semiconductor device, includes: a first inverter that operates on a first supply voltage and includes a transistor with a first polarity and a transistor with a second polarity different from the first polarity; a first inverter array that is connected to a gate of the transistor with the first polarity, includes a predetermined plural number of inverters connected in series, and operates on the first supply voltage; and a second inverter array that is connected to a gate of the transistor with the second polarity and includes inverters of the predetermined plural number connected in series, wherein a first stage inverter in the second inverter array operates on a second supply voltage that is higher than the first supply voltage, and a subsequent stage inverter subsequent to the first stage inverter operates on the first supply voltage.

6 Claims, 8 Drawing Sheets

(56) References Cited

U.S. PATENT DOCUMENTS

2015/0002206 A1* 1/2015 Nakamura .......... G11C 11/4076
  327/333
2017/0278553 A1* 9/2017 Kojima ................ G11C 7/1057
2019/0140635 A1* 5/2019 Abesingha ......... H03K 17/0822
2019/0172503 A1  6/2019 Takeda et al.

* cited by examiner

| | | | | |
|---|---|---|---|---|
| RISING INPUT 3.0 (v) | INVERTER 11 DELAY SHORT | INVERTER 12 DELAY SHORT | PMOS OFF | × |
| | INVERTER 13 DELAY SHORT | INVERTER 14 DELAY LONG | NMOS ON | H→L SLOW |
| FALLING INPUT 3.0 (v) | INVERTER 11 DELAY LONG | INVERTER 12 DELAY SHORT | PMOS ON | L→H SLOW |
| | INVERTER 13 DELAY SHORT | INVERTER 14 DELAY SHORT | NMOS OFF | × |

| RISING INPUT 3.0 (v) | INVERTER 22 | INVERTER 17 | SHORT DELAY TO LATER STAGE |
|---|---|---|---|
| | DELAY SHORT | DELAY SHORT | |
| FALLING INPUT 3.0 (v) | INVERTER 22 | INVERTER 17 | LONG DELAY TO LATER STAGE |
| | DELAY LONG | DELAY SHORT | |

SEMICONDUCTOR DEVICE AND METHOD OF CONTROLLING SEMICONDUCTOR DEVICE

CROSS-REFERENCE TO RELATED APPLICATION

This application is based on and claims priority under 35 USC 119 from Japanese Patent Application No. 2021-058177 filed on Mar. 30, 2021, the disclosure of which is incorporated by reference herein.

BACKGROUND

Technical Field

The present disclosure relates to a semiconductor device and a method of controlling a semiconductor device.

Related Art

In a semiconductor device, when input signals are transmitted over circuits in the semiconductor device, sometimes differences in delay times of output signals caused by the rising and falling edges of the input signals become a problem. "Rising edge" refers to the part of a waveform where an electrical signal transitions from a low level (hereinafter, "L") to a high level (hereinafter, "H"), and "falling edge" refers to the portion of a waveform where an electrical signal transitions from H to L. Furthermore, a signal transitioning from L to H is called a "rising signal" and a signal transitioning from H to L is called a "falling signal." Japanese Patent Application Laid-open (JP-A) No. H11-274317, for example, is known as a document in which technology relating to the above problem is disclosed.

The semiconductor device pertaining to JP-A No. H11-274317 includes a first CMOS inverter comprising a PMOS transistor with a relatively high gain and an NMOS transistor with a relatively low gain connected in series, a second CMOS inverter comprising a PMOS transistor with a relatively low gain and an NMOS transistor with a relatively high gain connected in series, with the second CMOS inverter being connected to an input terminal shared with the first CMOS inverter, and a signal synthesizing circuit that captures and inverts rising edges of output from the first CMOS inverter and falling edges of output from the second CMOS inverter.

In JP-A No. H11-274317, according to the semiconductor device with the above configuration, delay times of output signals with respect to rising and falling edges of input signals can be kept constant regardless of the magnitude of waveform rounding of the input signals.

Figure 6A:
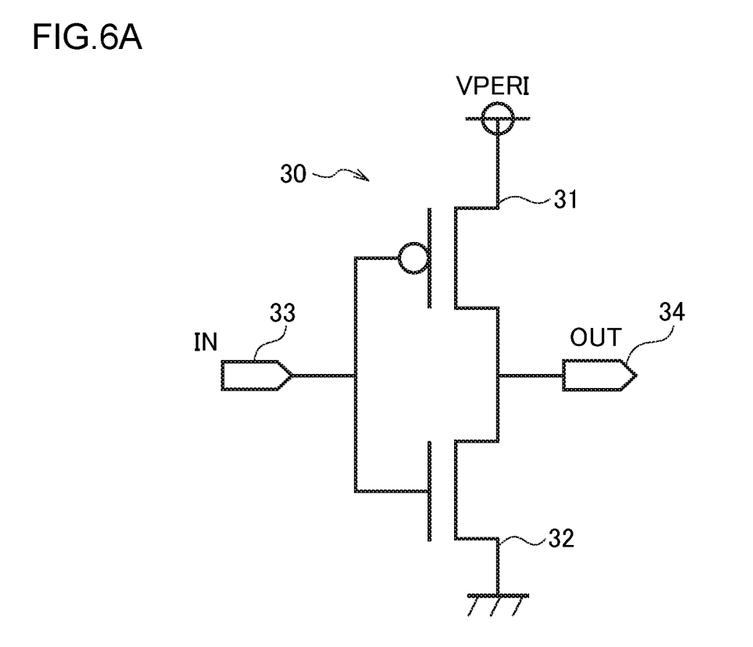
FIG. 6A is a circuit diagram of an inverter pertaining to prior art.
Figure 6B:
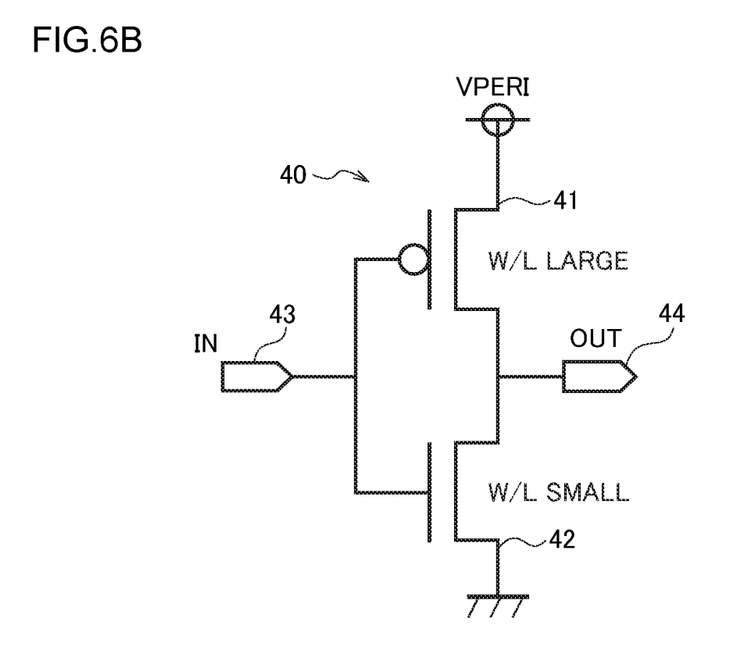
FIG. 6B is a circuit diagram of a delay matching circuit pertaining to a comparative example.

FIG. 6A shows an inverter 30 pertaining to prior art, and FIG. 6B shows a delay matching circuit 40 pertaining to a comparative example that is an example of a circuit (hereinafter, "delay matching circuit") that inhibits differences in delay times of output signals with respect to rising and falling input signals. The inverter 30 pertaining to the prior art in FIG. 6A is an inverter that includes a P-type metal-oxide-semiconductor field-effect transistor (MOS-FET) (hereinafter, "PMOS transistor") 31 and an N-type MOS-FET (hereinafter, "NMOS transistor") 32. An input terminal 33 that is a terminal of an input IN is connected to the gates of the PMOS transistor 31 and the NMOS transistor 32, and an output terminal 34 that is a terminal of an output OUT is connected to the drain of the PMOS transistor 31 and the drain of the NMOS transistor 32. A 1.5 V supply voltage is applied as a power supply VPERI to the source of the PMOS transistor 31, and GND that is a ground potential is applied to the source of the NMOS transistor 32. The delay matching circuit 40 of FIG. 6B is an inverter that includes a PMOS transistor 41 and an NMOS transistor 42. The basic configuration of the delay matching circuit 40 is the same as that of the inverter 30 pertaining to the prior art except that in the delay matching circuit 40 the W/L ratio of the PMOS transistor 41 is made relatively large with respect to the W/L ratio of the NMOS transistor 42. "W/L ratio" means the ratio of the gate width W to the gate length L of a MOS transistor. Generally, the larger W/L becomes, the more drain current increases and drive capability increases.

Figure 7A:
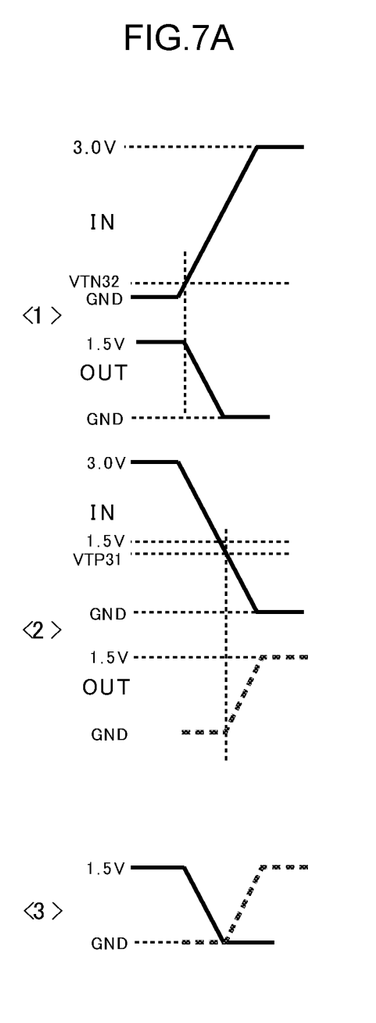
Figure 7B:
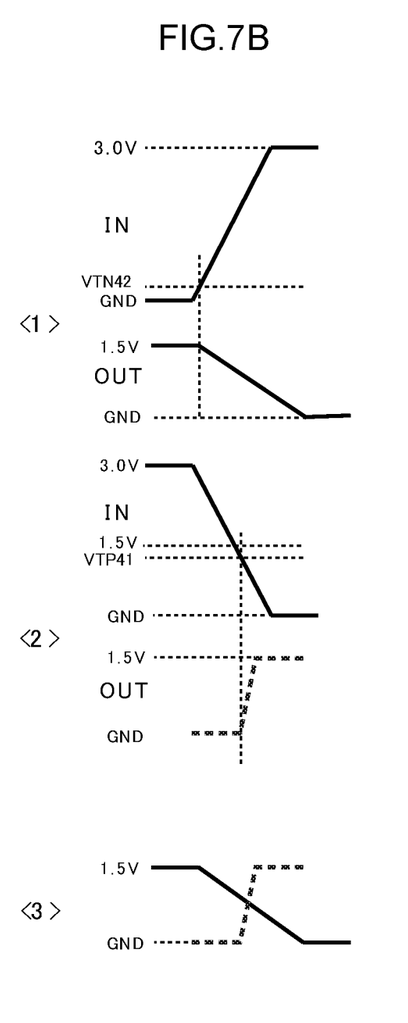

FIGS. 7A<1> to 7B<3> are drawings showing waveforms in each part of the delay matching circuit 40 as compared to waveforms in each part of the inverter 30 pertaining to the prior art. FIGS. 7A<1> to 7A<3> show waveforms in each part of the inverter 30 pertaining to the prior art, and FIGS. 7B<1> to 7B<3> show waveforms in each part of the delay matching circuit 40. FIG. 7A<1> shows the waveform of a falling output signal that is output from the output OUT when a rising input signal has been input to the input IN in the inverter 30 pertaining to the prior art, and FIG. 7A<2> shows the waveform of a rising output signal that is output from the output OUT when a falling input signal has been input to the input IN in the inverter 30 pertaining to the prior art. FIG. 7A<3> shows the waveform of the output signal of FIG. 7A<1> and the waveform of the output signal of FIG. 7A<2> superimposed on top of each other. A threshold value VTN32 of the NMOS transistor 32 of the inverter 30 pertaining to the prior art is positioned close to GND, and a threshold value VTP31 of the PMOS transistor 31 is positioned at a slightly lower potential than 1.5 V. Here, the time from when the input signal reaches 3.0/2 V to until the output signal reaches 1.5/2 V is a delay time. As shown in FIG. 7A<3>, the cross-point of the output waveforms is not positioned in the middle of the voltage axis (vertical axis) direction. Namely, whereas the timings when the rising and falling input signals reach 3.0/2 V, which is the middle of the voltage axis direction, are the same, the timing when the rising output signal reaches 1.5/2 V, which is the middle of the voltage axis direction, lags that of the falling output signal. In this way, in the inverter 30 pertaining to the prior art, the delay times of the output signals differ depending on the rising and falling edges of the input signals. This is because the falling output via the NMOS transistor 32 has a shorter delay time than the rising output via the PMOS transistor 31.

Similar to FIGS. 7A<1> to 7A<3>, FIG. 7B<1> shows the waveform of a falling output signal that is output from the output OUT when a rising input signal has been input to the input IN in the delay matching circuit 40, FIG. 7B<2> shows the waveform of a rising output signal that is output from the output OUT when a falling input signal has been input to the input IN in the delay matching circuit 40, and FIG. 7B<3> shows the waveform of the output signal of FIG. 7B<1> and the waveform of the output signal of FIG. 7B<2> superimposed on top of each other. A threshold value VTN42 of the NMOS transistor 42 of the delay matching circuit 40 is positioned close to GND, and a threshold value VTP41 of the PMOS transistor 41 is positioned at a slightly lower potential than 1.5 V. As is apparent from a comparison of the waveform of the output signal of FIG. 7B<1> and the waveform of the output signal of FIG. 7B<2>, the fall time of the falling output signal is longer than the rise time of the rising output signal. This is due to the current of the NMOS transistor 42 being restricted and the falling output signal that is the output of the NMOS transistor 42 being gentler because the W/L ratio of the NMOS transistor 42 is smaller than the W/L ratio of the PMOS transistor 41. However, referring to FIG. 7B<3>, it will be understood that the cross-point of the rising output signal and the falling output signal is near the middle of the voltage axis, and differences in the delay times of the output signals are inhibited in a case where the input signal rises and a case where the input signal falls.

In this connection, when circuits with plural functions are consolidated in a semiconductor device, sometimes supply voltages differ between the circuits. In this case, the delay matching circuit needs to inhibit differences in delay times of output signals with respect to rising and falling input signals also when electrical signals are transmitted from a prior stage circuit to a later stage circuit whose supply voltages are different. In this respect, the delay matching circuit 40 inhibits differences in delay times by having different W/L ratios for the MOS transistors, so when a potential fluctuation occurs in the supply voltage of the prior stage circuit, sometimes the delay matching circuit 40 becomes unable to exhibit its desired characteristics. Furthermore, the semiconductor device pertaining to JP-A No. H11-274317 also has as an object to keep delay times of output signals with respect to rising and falling edges of input signals constant, but JP-A No. H11-274317 does not consider the problem of differences in supply voltages between circuits.

SUMMARY

The present disclosure provides a semiconductor device, and a method of controlling a semiconductor device, that can inhibit differences in delay times of output signals with respect to rising and falling input signals when transmitting signals across circuits with different supply voltages.

A semiconductor device pertaining to the present disclosure includes: a first inverter that operates on a first supply voltage and includes a transistor with a first polarity and a transistor with a second polarity different from the first polarity; a first inverter array that is connected to a gate of the transistor with the first polarity, includes a predetermined plural number of inverters connected in series, and operates on the first supply voltage; and a second inverter array that is connected to a gate of the transistor with the second polarity and includes inverters of the predetermined plural number connected in series, wherein a first stage inverter in the second inverter array operates on a second supply voltage that is higher than the first supply voltage, and a subsequent stage inverter subsequent to the first stage inverter operates on the first supply voltage.

A semiconductor device control method pertaining to the present disclosure is a method of controlling a semiconductor device that inhibits differences in delay times of output signals with respect to rising and falling input signals in a case of transmitting signals from a circuit with a high supply voltage to a circuit with a low supply voltage, the method comprising: making a level difference between a high level and a low level of a high voltage inverter that operates on the high supply voltage greater than a level difference between a high level and a low level of a low voltage inverter that operates on the low supply voltage; and inhibiting differences in the delay times by using an occurrence of a delay caused by a difference between a threshold value of a transistor with a first polarity included in the low voltage inverter and the high level in transition of the high voltage inverter from the high level to the low level due to a signal from the high voltage inverter being received by the low voltage inverter.

According to the present disclosure, the effect is achieved that a semiconductor device, and a method of controlling a semiconductor device, that can inhibit differences in delay times of output signals with respect to rising and falling input signals when transmitting signals across circuits with different supply voltages can be provided.

BRIEF DESCRIPTION OF THE DRAWINGS

An exemplary embodiment of the present disclosure will be described in detail based on the following figures, wherein:

FIGS. 7A<1> to 7A<3> are diagrams showing waveforms in each part of the inverter pertaining to the prior art;

FIGS. 7B<1> to 7B<3> are diagrams showing waveforms in each part of the delay matching circuit pertaining to the comparative example;

DETAILED DESCRIPTION

An embodiment of the present disclosure will be described in detail below with reference to the drawings. In the embodiment described below, a configuration where the semiconductor device pertaining to the disclosure is applied to a circuit including a delay matching circuit is described as an example. That is, the semiconductor device pertaining to this embodiment may have a configuration comprising solely a delay matching circuit or may have a configuration including peripheral circuits. "Delay matching circuit" in this embodiment is, as described above, a circuit that inhibits differences in delay times of output signals between a case where an input signal rises and a case where the input signal falls.

Figure 1:
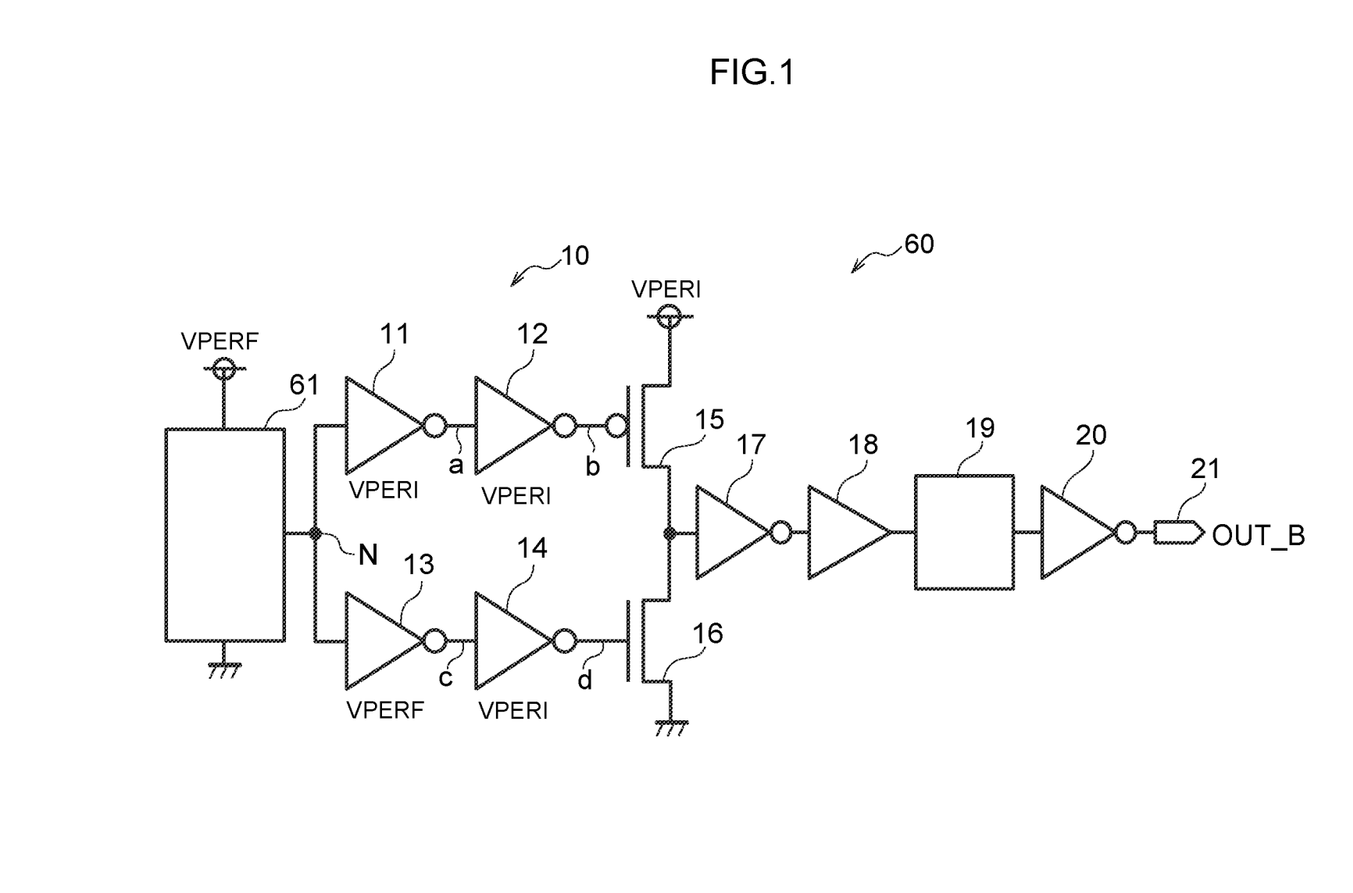
FIG. 1 is a block diagram showing an example of a configuration of an input interface pertaining to the embodiment.

FIG. 1 is a block diagram showing, together with an input circuit 61 of a prior stage circuit, an input interface 60 including a delay matching circuit 10 pertaining to this embodiment. The input interface 60 is a circuit for adjusting setup times and hold times of data signals that are input signals sent from the input circuit 61, and has the function of adjusting the relative temporal relationship of the data signals with respect to a clock signal (not shown in the drawings). The input circuit 61 is a part that sends the data signals to the input interface 60. The delay matching circuit 10 has the function of inhibiting differences in delay times with respect to rising and falling edges of the signals sent from the input circuit 61 as a prior stage in the adjustment of the temporal relationship. Here, in this embodiment, a power supply VPERF for the input circuit 61 of the prior stage circuit is set to a 3.0 V supply voltage, and a power supply VPERI for the input interface 60 (excluding a later-described part) is set to a 1.5 V supply voltage. That is, the supply voltage to the input interface 60 is a lower supply voltage than the supply voltage to the input circuit 61 of the prior stage circuit. This means the input interface 60 converts a high supply voltage to a low supply voltage because it is necessary to ensure a withstand voltage in the case of a process where the circuit to which is input the output from the input interface 60 is shrunk, for example. The input circuit 61 of the prior stage circuit pertaining to this embodiment is disposed in an interface with an external circuit and has a high supply voltage conforming to the supply voltage to the external circuit. However, the above supply voltages are an example and may also be other supply voltages as long as they meet the condition that the supply voltage to the input circuit 61 of the prior stage circuit is higher than the supply voltage to the input interface 60. Furthermore, in this embodiment, an input interface for data signals is described as an example, but the signals are not limited to this and may also be other signals such as clock signals.

As shown in FIG. 1, the delay matching circuit 10 includes inverters 11, 12, 13, and 14, a PMOS transistor 15, and an NMOS transistor 16. The PMOS transistor 15 and the NMOS transistor 16 are an inverter that receives different signals at their gates. The delay matching circuit 10 basically operates on a supply voltage of 1.5 V (hereinafter, 1.5 V system) as an example of the power supply VPERI, and just the inverter 13 operates on a supply voltage of 3.0 V (hereinafter, 3.0 V system) as an example of the power supply VPERF.

The input interface 60 includes the delay matching circuit 10, an inverter 17, a buffer 18, a delay adjustment circuit 19, and an inverter 20. The input interface 60 uses the delay matching circuit 10 to uniformize delay times of rising and falling input signals with respect to the data signals input from the input circuit 61 of the prior stage circuit and uses the delay adjustment circuit 19 to adjust the delay times. The output of the delay matching circuit 10 is sent via the inverter 17 and the buffer 18 to the delay adjustment circuit 19, and the output of the delay adjustment circuit 19 is output via the inverter 20 from an output terminal 21 that is a terminal of an output OUT_B.

Figure 2:
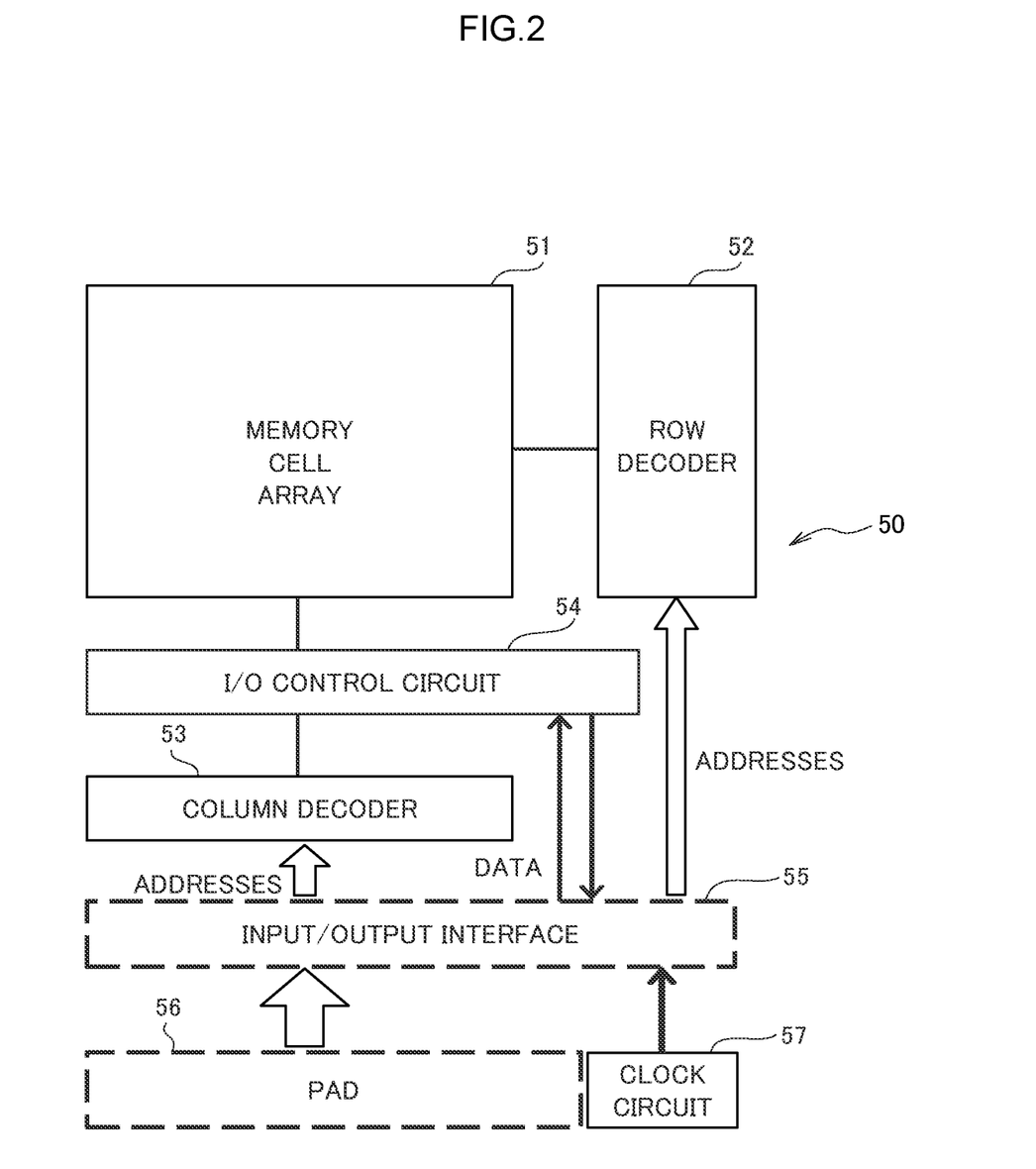
FIG. 2 is a block diagram showing an example of a configuration of a DRAM memory pertaining to the embodiment.

Here, an example of a configuration where the input interface 60 is applied in a semiconductor device will be described with reference to FIG. 2 and FIG. 3. FIG. 2 shows the configuration of a DRAM memory 50 equipped with the input interface 60. As shown in FIG. 2, the DRAM memory 50 includes a memory cell array 51, a row decoder 52, a column decoder 53, an I/O control circuit 54, an input/output interface 55, a pad 56, and a clock circuit 57. In this example, the input interface 60 is provided in the interface between the pad 56 and the memory cell 51 as well as its attached circuits and transfers various data signals.

In this example, the input/output interface 55 transfers relevant addresses to the row decoder 52 and column decoder 53 based on write, read, and other requests from the pad 56. The I/O control circuit 54 writes data to and reads data from the memory cell array 51. The clock circuit 57 generates a clock signal for synchronously controlling the entire DRAM memory 50.

Figure 3:
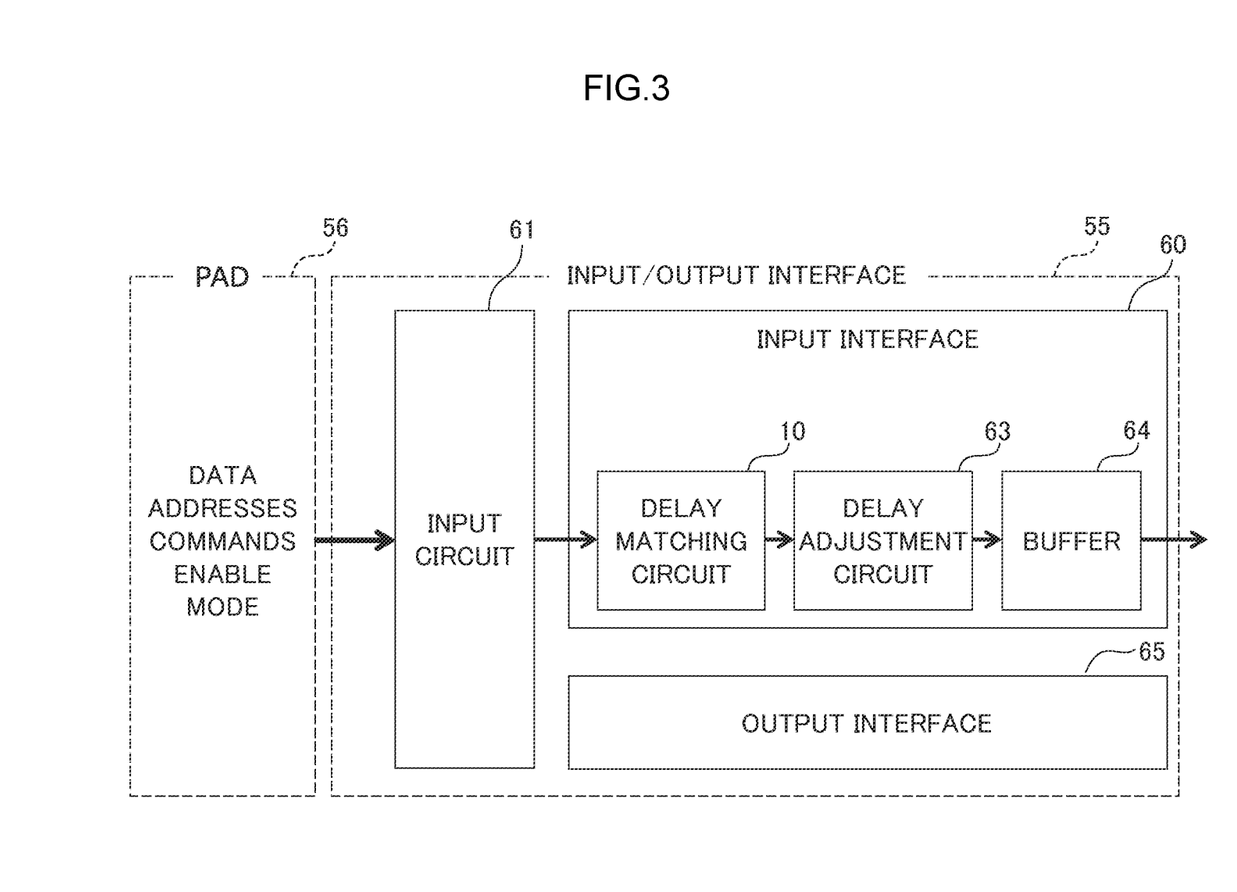
FIG. 3 is a block diagram showing an example of a configuration of an input/output interface pertaining to the embodiment.

FIG. 3 is a diagram describing the input/output interface 55 in greater detail. As shown in FIG. 3, data, address, command, enable, mode, and other various data signals are input from outside via the pad 56 (here, notated as PAD) to the input/output interface 55. The input/output interface 55 includes an input circuit 61, an input interface 60, and an output interface 65. In this embodiment, detailed description of the output interface 65 will be omitted. The input interface 60 includes a delay matching circuit 10, a delay adjustment circuit 63, and a buffer 64. The delay matching circuit 10 is the same circuit as the delay matching circuit 10 shown in FIG. 1, the delay adjustment circuit 63 corresponds to a circuit in which the inverter 17 and the buffer 18 are added to the delay adjustment circuit 19 shown in FIG. 1, and the buffer 64 corresponds to the inverter 20. Furthermore, the input circuit 61 corresponds to the input circuit 61 shown in FIG. 1.

The input circuit 61 judges, in regard to the data signals sent from the pad 56, whether to receive the data or transfer it on. Specifically, the input circuit 61 selects test modes and determines input combinations of enable signals, for example. As regards input signals transferred from the input circuit 61, differences in delay times in a case where the input signal is a rising signal and a case where the input signal is a falling signal are inhibited in the delay matching circuit 10. The delay adjustment circuit 63 adjusts setup times and hold times of the data signals with respect to a clock signal not shown in the drawings. Signals whose delay has been adjusted are output via the buffer 64.

Here, referring again to FIG. 1, the configuration and operation of the delay matching circuit 10 will be described in greater detail. As mentioned above, the delay matching circuit 10 includes the inverters 11, 12, 13, and 14, the PMOS transistor 15, and the NMOS transistor 16. The inverter 11 and the inverter 12 configure a series-connected inverter array, and the inverter 13 and the inverter 14 configure a series-connected inverter array. Only the supply voltage of the inverter 13 is 3.0 V as the power supply VPERF, and the other inverters 11, 12, and 14 and the inverter formed by the PMOS transistor 15 and the NMOS transistor 16 are supplied with 1.5 V as the power supply VPERI. Input signals from the input circuit 61 are split in two, with one being received by the inverter 11 of the 1.5 V system and the other being received by the inverter 13 of the 3.0 V system. The output of the inverter 11 is received by the inverter 12 and the output of the inverter 13 is received by the inverter 14, but the inverter 12 and the inverter 14 both belong to the 1.5 V system. The output of the inverter 12 is input to the gate of the PMOS transistor 15 and drives the PMOS transistor 15, and the output of the inverter 14 is input to the gate of the NMOS transistor 16 and drives the NMOS transistor 16. The output of the inverter configured by the PMOS transistor 15 and the NMOS transistor 16 is transmitted via the inverter 17 and the buffer 18 to the delay adjustment circuit 19.

Figure 4A:
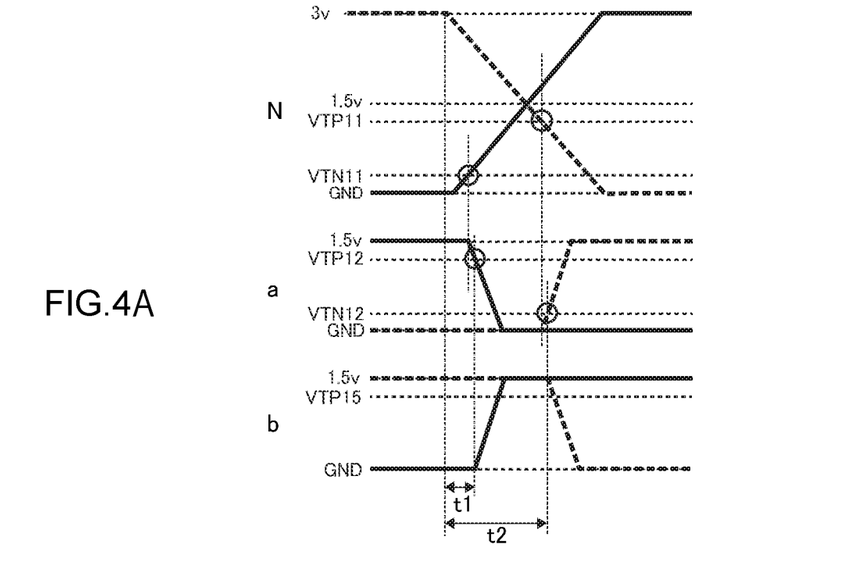
FIG. 4A is a diagram showing waveforms in each part of a P path in a delay matching circuit pertaining to the embodiment.
Figure 4B:
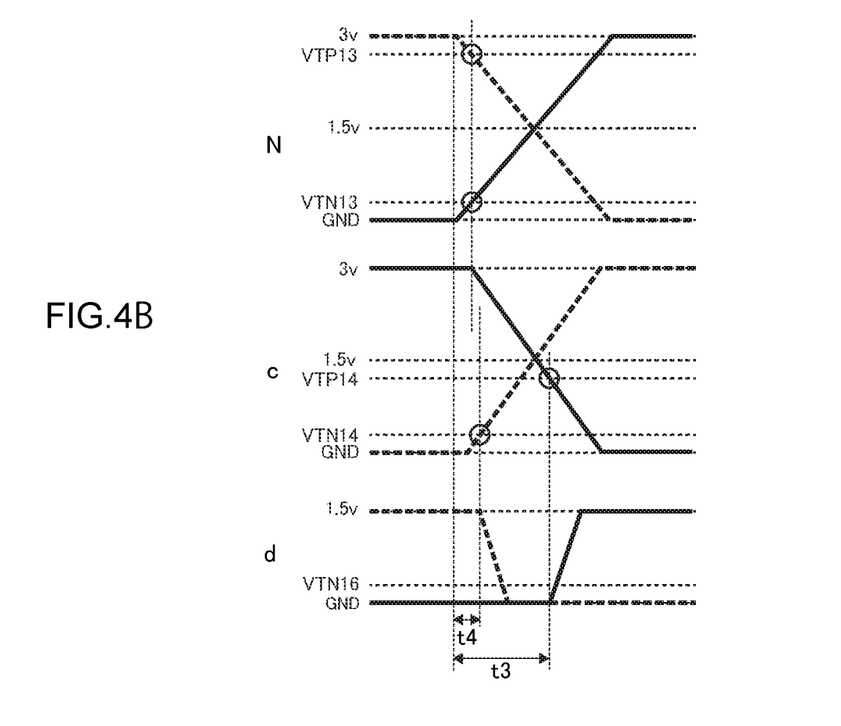
FIG. 4B is a diagram showing waveforms in each part of an N path in the delay matching circuit pertaining to the embodiment.

Next, the operation of the delay matching circuit 10 will be described in greater detail with reference to FIG. 4A to FIG. 5. FIGS. 4A and 4B show waveforms in each part when a rising signal and a falling signal have been input to the delay matching circuit 10. FIG. 4A shows waveforms in each part of a path (hereinafter, sometimes called "the P path") leading from the input circuit 61 via the inverters 11 and 12 to the PMOS transistor 15, and FIG. 4B shows waveforms in each part of a path (hereinafter, sometimes called "the N path") leading from the input circuit 61 via the inverters 13 and 14 to the NMOS transistor 16.

The waveforms denoted by reference sign N in FIG. 4A and FIG. 4B represent waveforms at node N shown in FIG. 1, that is, waveforms of input signals to the delay matching circuit 10. The waveforms denoted by reference signs a and b in FIG. 4A represent waveforms of output signals at nodes a and b shown in FIG. 1, that is, waveforms of output signals from the inverter 11 and the inverter 12. The waveforms denoted by reference signs c and d in FIG. 4B represent waveforms of output signals at nodes c and d shown in FIG. 1, that is, waveforms of output signals from the inverter 13 and the inverter 14. The waveforms at node N are distinguished such that the solid line represents a rising signal and the dashed line represents a falling signal. The distinction between solid lines and dashed lines in the waveforms at nodes a, b, c, and d corresponds to the distinction between the solid line and the dashed line for the input signals at node N. Furthermore, in the following description, the logic levels of the 3.0 V system are H=3.0 V and L=GND (ground), and the logic levels of the 1.5 V system are H=1.5 V and L=GND. However, the logic levels are not limited to these and may also be other appropriate logic levels as long as they satisfy the condition that the logic levels of the input circuit 61 of the prior stage circuit are broader than the logic levels of the input interface 60.

First, the P path will be described with reference to FIG. 4A. Hereinafter, the rising signal at node N will be called the rising input signal and the falling signal will be called the falling input signal, and the rising signal at node b will be called the rising output signal and the falling signal will be called the falling output signal. Referring to the waveforms indicated by b in FIG. 4A, the waveform of the falling output signal corresponding to the falling input signal lags the waveform of the rising output signal corresponding to the rising input signal. That is, the waveform of the falling output signal has a longer delay time than the waveform of the rising output signal. This is due to the following reason. The threshold values with respect to the input signals represented by N in FIG. 4A are the threshold values of the inverter 11, that is, the threshold values of the 1.5 V system. Considering the rising input signal, a threshold value VTN11 of the NMOS transistor (not shown in the drawings) of the inverter 11 is close to GND as indicated by the solid line in N, so the NMOS transistor of the inverter 11 switches on with a relatively short delay and the output of the inverter 11 becomes a falling waveform indicated by the solid line in a. The threshold value with respect to the waveform of the output signal from the inverter 11 indicated by the solid line in a is the threshold value of the inverter 12, that is, the threshold value of the 1.5 V system. Consequently, as indicated by the solid line in a, because a threshold value VTP12 of a PMOS transistor (not shown in the drawings) of the inverter 12 is positioned at a slightly lower potential than 1.5 V which is H, the PMOS transistor of the transistor 12 switches on with a relatively short delay, and the output of the inverter 12 becomes a rising waveform represented by the solid line in b. The delay time of the rising output signal with respect to the rising input signal is delay time t1 as shown in FIG. 4A.

Next, considering the falling input signal represented by the dashed line in N in FIG. 4A, a threshold value VTP11 of a PMOS transistor of the inverter 11 is close to 1.5 V, so compared to the case of the rising input signal, it takes time for the input signal to reach the threshold value VTP11 from 3.0 which is H. As a result, the PMOS transistor of the inverter 11 switches on with a relatively long delay, and the output of the inverter 11 becomes a rising waveform represented by the dashed line in a. The threshold value with respect to the waveform of the output signal from the inverter 11 represented by the dashed line in a is the threshold value of the inverter 12, that is, the threshold value of the 1.5 V system. Consequently, because a threshold value VTN12 of an NMOS transistor of the inverter 12 is positioned at a slightly higher potential than GND which is L as indicated by the solid line in a, the NMOS transistor of the inverter 12 switches on with a relatively short delay, and the output of the inverter 12 becomes a falling waveform represented by the dashed line in b. The delay time of the falling output signal with respect to the falling input signal becomes delay time t2 as shown in FIG. 4A.

As is apparent from the above description, delay time t2 becomes longer than delay time t1. Namely, the waveform of the falling output signal corresponding to the falling input signal lags the waveform of the rising output signal corresponding to the rising input signal. Here, the reason the delay time becomes longer is that the threshold value VTP11 of the inverter 11 of the 1.5 V system with respect to the falling input signal of the 3.0 V system represented by the dashed line in N of FIG. 4A is positioned at a slightly lower potential than 1.5 V. FIG. 4A shows the P path, so it is the PMOS transistor 15 that is connected to node b. The PMOS transistor 15 has the threshold value of the 1.5 V system, and a threshold value VTP15 of the PMOS transistor 15 is positioned at a slightly lower potential than 1.5 V which is H. Consequently, the PMOS transistor 15 is switched off by the rising output signal represented by the solid line in b with the short delay time and is switched on by the falling output signal indicated by the dashed line in b with the long delay time.

Next, the N path will be described with reference to FIG. 4B. Hereinafter, the rising signal at node N will be called the rising input signal and the falling signal will be called the falling input signal, and the rising signal at node d will be called the rising output signal and the falling signal will be called the falling output signal. Referring to the waveforms indicated by d in FIG. 4B, the waveform of the rising output signal corresponding to the rising input signal lags the waveform of the falling output signal corresponding to the falling input signal. That is, the waveform of the rising output signal has a longer delay time than the waveform of the falling output signal. This is due to the following reason. The threshold values with respect to the input signals represented by N in FIG. 4B are the threshold values of the inverter 13, that is, the threshold values of the 3.0 V system. Considering the rising input signal, a threshold value VTN13 of an NMOS transistor (not shown in the drawings) of the inverter 13 is close to GND, so the NMOS transistor of the inverter 13 switches on with a relatively short delay and the output of the inverter 13 becomes a falling waveform indicated by the solid line in c. The threshold value with respect to the waveform of the output signal from the inverter 13 indicated by the solid line in c is the threshold value of the inverter 14, that is, the threshold value of the 1.5 V system. Consequently, as indicated by the solid line in c, because a threshold value VTP14 of a PMOS transistor of the inverter 14 is positioned at a slightly lower potential than 1.5 V, it takes time for the signal to reach the threshold value VTP14 from 3.0 V, the PMOS transistor of the transistor 14 switches on with a relatively long delay, and the output of the inverter 14 becomes a rising waveform represented by the solid line in d. The delay time of the rising output signal with respect to the rising input signal is delay time t3 as shown in FIG. 4B.

Next, considering the falling input signal represented by the dashed line in N of FIG. 4B, a threshold value VTP13 of a PMOS transistor of the inverter 13 is close to 3.0 V, so the PMOS transistor of the inverter 13 switches on with a relatively short delay, and the waveform of the output signal from the inverter 13 becomes the waveform represented by the dashed line in c. The threshold value with respect to the waveform of the output signal from the inverter 13 represented by the dashed line in c becomes the threshold value of the inverter 14, that is, the threshold value of the 1.5 V system. Consequently, as indicated by the solid line in c, because a threshold value VTN14 of an NMOS transistor of the inverter 14 is positioned at a slightly higher potential than GND which is L, the NMOS transistor of the inverter 14 switches on with a relatively short delay, and the output of the inverter 14 becomes a falling waveform represented by the dashed line in d. The delay time of the falling output signal with respect to the falling input signal becomes delay time t4 as shown in FIG. 4B.

As is apparent from the above description, delay time t3 becomes longer than delay time t4. Namely, the waveform of the rising output signal corresponding to the rising input signal lags the waveform of the falling output signal corresponding to the falling input signal. Here, the reason the delay time becomes longer is that the threshold value VTP14 of the PMOS transistor of the inverter 14 of the 1.5 V system with respect to the falling input signal of the 3.0 V system represented by the solid line in c of FIG. 4B is positioned at a slightly lower potential than 1.5 V. FIG. 4B shows the N path, so it is the NMOS transistor 16 that is connected to node d. Regarding the NMOS transistor 16, a threshold value VTN16 of the NMOS transistor 16 is positioned at a slightly higher potential than GND which is L. Consequently, the NMOS transistor 16 is switched off by the falling output signal represented by the dashed line in c with the short delay time and is switched on by the rising output signal indicated by the dashed line in d with the long delay time.

To summarize the above, in the P path, the PMOS transistor 15 is switched on by the falling output signal (the signal represented by the dashed line in b of FIG. 4A) from the inverter 12 whose delay is relatively long, and in the N path, the NMOS transistor 16 is switched on by the rising output signal (the signal indicated by the solid line in d of FIG. 4B) from the inverter 14 whose delay is relatively long. That is, in the delay matching circuit 10, both the PMOS transistor 15 and the NMOS transistor 16 are switched on by signals whose delays are similarly increased, so differences in delay times of output signals in a case where the input signal rises and a case where the input signal falls can be inhibited.

Figure 5:
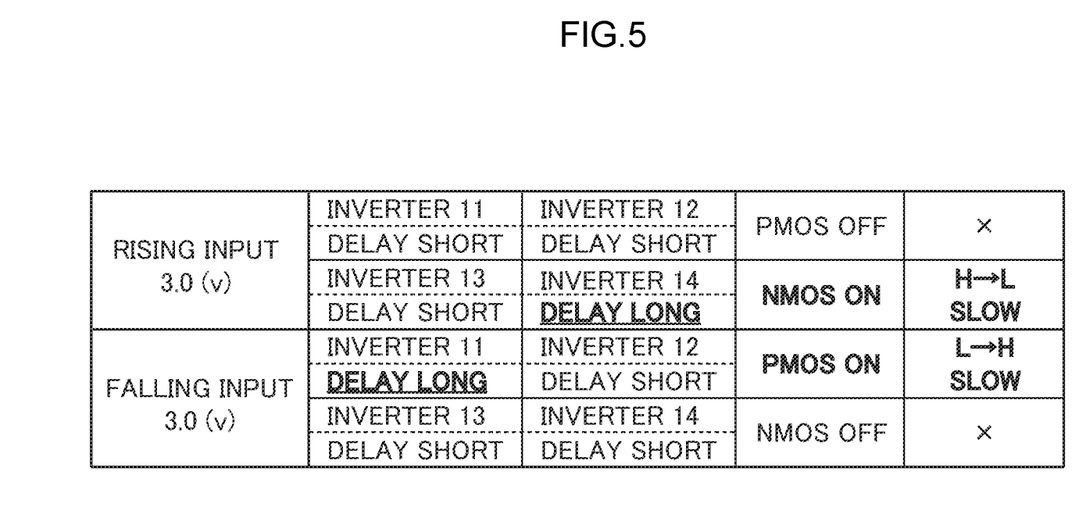
FIG. 5 is a drawing summarizing the operation of the delay matching circuit pertaining to the embodiment.

FIG. 5 shows the above description put into a table. The rising input line shows the operation where the PMOS transistor 15 switches off in the P path and the NMOS transistor 16 switches on in the N path. "Delay short" means that the delay time is relatively short, and "delay long" means that the delay time is relatively long. In this case, the delay times of the inverters 11, 12, and 13 are relatively short, but the delay time of the inverter 14 becomes relatively long. Because of this, the timing when the NMOS transistor 16 switches on is slow. The falling input line shows the operation where the NMOS transistor 16 switches off in the N path and the PMOS transistor 15 switches on in the P path. In this case, the delay times of the inverters 12, 13, and 14 are relatively short, but the delay time of the inverter 11 becomes relatively long. Because of this, the timing when the PMOS transistor 15 switches on is slow. That is, the PMOS transistor 15 and the NMOS transistor 16 similarly switch on with a relatively long delay, so differences in delay times of output signals in a case where the input signal rises and a case where the input signal falls can be inhibited.

Figure 8A:
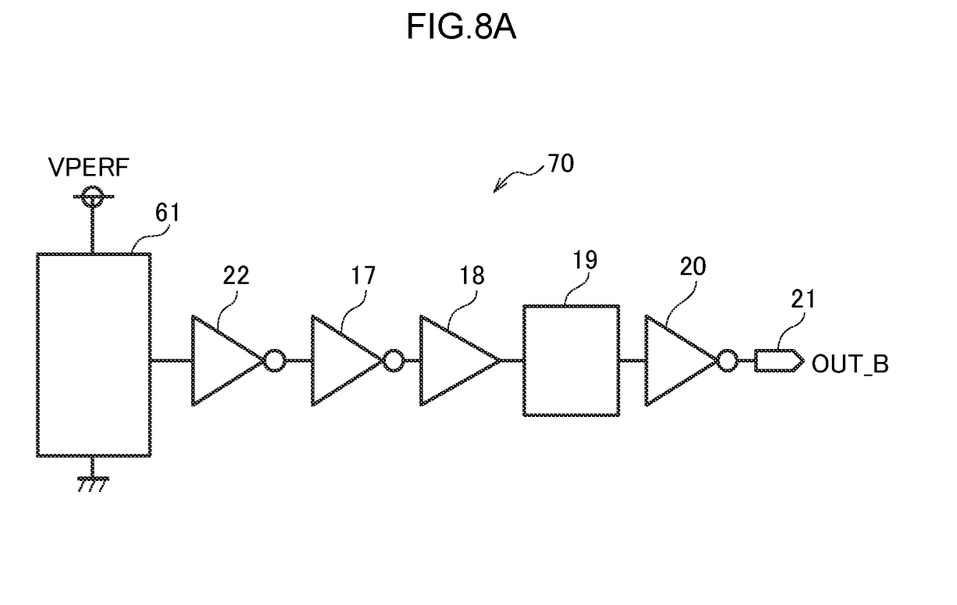
FIG. 8A is a block diagram showing a configuration of an input interface pertaining to a comparative example.

Here, referring to FIG. 8A and FIG. 8B, an input interface 70 pertaining to a comparative example will be described for comparison. As shown in FIG. 8A, the input interface 70 includes inverters 22, 17, and 20, a buffer 18, and a delay adjustment circuit 19. The inverters 17 and 20, the buffer 18, and the delay adjustment circuit 19 are the same as the inverters 17 and 20, the buffer 18, and the delay adjustment circuit 19 shown in FIG. 1. That is, compared to the input interface 60, the input interface 70 differs in that the delay matching circuit 10 is replaced with the inverter 22. The input interface 70, like the input interface 60, also inhibits differences in delay times of output signals in a case where the input signal from the input circuit 61 of the prior stage circuit rises and a case where it falls, and sets setup times and hold times by adjusting the delay times of input signals with respect to a clock signal not shown in the drawings.

In the input interface 70, the inverter 22 has the function of a delay matching circuit. That is, the inverter 22 is configured by, for example, the inverter 30 pertaining to the prior art shown in FIG. 6A. The supply voltage to the input circuit 61 of the prior stage circuit is the power supply VPERF and is 3.0 V, and the supply voltage to the input interface 70 is the power supply VPERI and is 1.5 V. The delays in the inverter 22 and the inverter 17 of the input interface 70 are as follows considering them in the same way as in the case of the input interface 60. That is, in a case where the input signal to the input interface 70, namely, the output signal from the input circuit 61, is a rising signal, a threshold voltage VTN of the NMOS transistor (not shown in the drawings) of the inverter 22 is at a slightly higher potential than GND, so even when the input signal rises from GND to 3.0V which is H, the inverter 22 switches on with a relatively short delay time and outputs a falling signal. The threshold value of the PMOS transistor (not shown in the drawings) of the inverter 17 is at a slightly lower potential than 1.5 V, so the inverter 17 switches on with a relatively short delay time and outputs a rising signal.

In contrast, when the input signal to the input interface 70 is a falling signal, it takes time for the input signal to reach the threshold value VTP from 3.0 V which is H because the threshold value VTP of the PMOS transistor (not shown in the drawings) of the inverter 22 is at a slightly lower potential than 1.5 V, and the inverter 22 switches on with a relatively long delay time and outputs a rising signal. The threshold value of the NMOS transistor of the inverter 17 is at a slightly higher potential than GND, so the inverter 17 switches on with a relatively short delay time and outputs a falling signal.

Figure 8B:
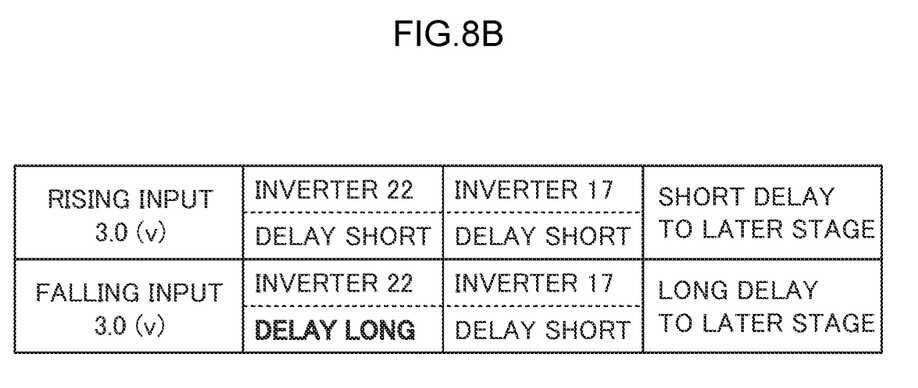
FIG. 8B is a diagram summarizing the operation of the input interface pertaining to the comparative example.

FIG. 8B is a table summarizing the above operation of the input interface 70. As shown in FIG. 8B, in the case of a rising input, the delay time of the output signal from the input interface 70 becomes relatively short because the inverter 22 and the inverter 17 both have relatively short delay times. However, in the case of a falling input, the delay time of the output signal from the input interface 70 becomes relatively long because the delay time of the inverter 17 is relatively short but the delay time of the inverter 22 is relatively long. Because of this, the input interface 70 pertaining to the comparative example cannot inhibit differences in delay times of output signals between a case where the input signal rises and a case where the input signal falls.

Furthermore, even if the delay matching circuit 40 shown in FIG. 6B were used, if there are potential fluctuations in the supply voltage to the input circuit 61 that is a prior stage circuit, differences end up appearing in the delay times of the output signals between a case where the input signal rises and a case where the input signal falls. This is because the W/L ratios of the PMOS transistor 31 and the NMOS transistor 32 of the delay matching circuit 40 are adjusted to inhibit differences in delay times of output signals with respect to a certain fixed supply voltage to the input circuit 61.

In the delay matching circuit 10 pertaining to this embodiment, even if there are potential fluctuations in the supply voltage to the input circuit 61 that is a prior stage circuit, the potential fluctuations occur in both the falling signal in the P path and the rising signal in the N path, so the result is that the differences in the delay times of the output signals do not change.

It will be noted that although in the above embodiment a configuration where two inverters each are connected to each of the P path and the N path in the delay matching circuit 10 was described as an example, the disclosure is not limited to this, and the delay matching circuit may also have a configuration where inverters are connected in numbers needed in consideration of drive capability and the like. Furthermore, in the input interface 60 also, inverters, buffers, and the like may be connected in numbers needed in consideration of drive capability and the like.

What is claimed is:

1. A semiconductor device comprising:
   a first inverter that operates on a first supply voltage and includes a transistor with a first polarity and a transistor with a second polarity different from the first polarity;
   a first inverter array that is connected to a gate of the transistor with the first polarity, includes a predetermined plural number of inverters connected in series, and operates on the first supply voltage; and
   a second inverter array that is connected to a gate of the transistor with the second polarity and includes inverters of the predetermined plural number connected in series,
   wherein a first stage inverter in the second inverter array operates on a second supply voltage that is higher than the first supply voltage, and a subsequent stage inverter subsequent to the first stage inverter operates on the first supply voltage.

2. The semiconductor device of claim 1, further comprising a prior stage circuit that outputs a predetermined signal and operates on the second supply voltage,
   wherein output signals split in two from the prior stage circuit are input to each of the first inverter array and the second inverter array.

3. The semiconductor device of claim 2, wherein:
   the output signals are data signals,
   the semiconductor device further comprises a delay adjustment circuit connected to an output of the first inverter, and
   the delay adjustment circuit adjusts delays of the data signals input from the prior stage circuit.

4. The semiconductor device of claim 1, wherein:
   signals in a case of operating on the first supply voltage are signals that switch the first supply voltage to a high level and switch a first voltage to a low level, and
   signals in a case of operating on the second supply voltage are signals that switch the second supply voltage to a high level and switch the first voltage to a low level.

5. The semiconductor device of claim 1, wherein the predetermined plural number of inverters is two.

6. A method of controlling a semiconductor device that inhibits differences in delay times of output signals with respect to rising and falling input signals in a case of transmitting signals from a circuit with a high supply voltage to a circuit with a low supply voltage, the method comprising:
   making a level difference between a high level and a low level of a high voltage inverter that operates on the high supply voltage greater than a level difference between a high level and a low level of a low voltage inverter that operates on the low supply voltage; and
   inhibiting differences in the delay times by using an occurrence of a delay caused by a difference between a threshold value of a transistor with a first polarity included in the low voltage inverter and the high level in transition of the high voltage inverter from the high level to the low level due to a signal from the high voltage inverter being received by the low voltage inverter.

* * * * *